(12) United States Patent
Quelen

(10) Patent No.: US 11,940,825 B2
(45) Date of Patent: Mar. 26, 2024

(54) SELF-BIASED OR BIASING TRANSISTOR(S) FOR AN ELECTRONIC VOLTAGE DIVIDER CIRCUIT, USING INSULATING THIN-FILM OR FDSOI (FULLY DEPLETED SILICON ON INSULATOR) TECHNOLOGY

(71) Applicant: COMMISSARIAT A L'ENERGIE ATOMIQUE ET AUX ENERGIES ALTERNATIVES, Paris (FR)

(72) Inventor: Anthony Quelen, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 582 days.

(21) Appl. No.: 17/247,249

(22) Filed: Dec. 4, 2020

(65) Prior Publication Data

US 2021/0173421 A1    Jun. 10, 2021

(30) Foreign Application Priority Data

Dec. 6, 2019 (FR) .................................... 1913861

(51) Int. Cl.
*G05F 1/56*     (2006.01)
*H01L 27/092*    (2006.01)
(Continued)

(52) U.S. Cl.
CPC .............. *G05F 1/56* (2013.01); *H01L 27/092* (2013.01); *H01L 27/1203* (2013.01);
(Continued)

(58) Field of Classification Search
CPC . G05F 3/262; G05F 3/26; G05F 3/245; G05F 3/10; G05F 3/16; G05F 3/18;
(Continued)

(56) References Cited

U.S. PATENT DOCUMENTS 5,912,591 A * 6/1999 Yamada ............... H03K 3/0322
                                           331/108 C
6,404,229 B1 * 6/2002 Barnes ............. H03K 3/356113
                                            326/119
(Continued)

FOREIGN PATENT DOCUMENTS

EP        3176669 A1 * 6/2017 ............. G05F 3/242
WO    2010/112585 A1   10/2010

OTHER PUBLICATIONS

Bonnoit, "Reducing power using body biasing in microprocessors with dynamic voltage/frequency scaling", Apr. 2010.
(Continued)

*Primary Examiner* — Thienvu V Tran
*Assistant Examiner* — Nusrat Quddus
(74) *Attorney, Agent, or Firm* — BakerHostetler

(57) ABSTRACT

A voltage divider circuit includes at least two FDSOI transistors (TP1, TP2) of a first type connected to a first supply potential and arranged in a current mirror structure, two FDSOI transistors (TN1, TN2) of a second type and an electrical load (R), the drain of a first—respectively second—transistor (TN1) of the second type being connected to the drain of a first—respectively second—transistor (TP1) of the first type, the drain of the first transistor of the second type being connected to the front-face gate of this same transistor, the front-face gates of the first and second transistors of the second type being connected to one another, the source of the first transistor of the second type being connected to a second supply potential and the load being placed between the source of the second transistor of the second type and the second supply potential. The back-face gates of the first and second transistors of the second type (TN2) are connected to an external circuit applying an input voltage between these two back-face gates, the voltage (Continued)

across the terminals of the load ($V_{RO}$) constituting an output voltage equal to a fraction of the input voltage.

13 Claims, 9 Drawing Sheets

(51) Int. Cl.
    *H01L 27/12*     (2006.01)
    *H01L 29/423*     (2006.01)
    *H01L 29/78*     (2006.01)

(52) U.S. Cl.
    CPC .... *H01L 29/42376* (2013.01); *H01L 29/7831* (2013.01); *H01L 29/7838* (2013.01)

(58) Field of Classification Search
    CPC ... G05F 3/185; G05F 3/20; G05F 3/30; G05F 3/205; G05F 3/22; G05F 3/24; G05F 3/222; G05F 3/242; G05F 3/225; G05F 3/227; G05F 3/247; G05F 3/265; G05F 3/267; G05F 1/463; G05F 1/468; G05F 1/46; G05F 1/461; G05F 1/575; G05F 1/465
    USPC .......................................... 327/534
    See application file for complete search history.

(56) References Cited

U.S. PATENT DOCUMENTS

| | | | | |
|---|---|---|---|---|
| 9,397,622 | B2* | 7/2016 | Vashishtha | H03K 5/2481 |
| 9,632,521 | B2* | 4/2017 | Iriarte | G05F 3/242 |
| 10,037,047 | B2* | 7/2018 | Quelen | G05F 3/267 |
| 2002/0158614 | A1 | 10/2002 | Kimura | |
| 2008/0001658 | A1* | 1/2008 | Mojarradi | G06G 7/16 327/581 |
| 2012/0218026 | A1* | 8/2012 | Nadimpalli | G05F 3/242 327/535 |
| 2014/0077864 | A1* | 3/2014 | Bianchi | G01K 7/01 327/512 |
| 2016/0352339 | A1* | 12/2016 | Kim | H03K 3/011 |
| 2017/0153659 | A1 | 6/2017 | Quelen | |
| 2017/0324385 | A1* | 11/2017 | McKay | H01L 21/67011 |
| 2019/0356305 | A1* | 11/2019 | Ozawa | H01L 27/0222 |

OTHER PUBLICATIONS

Noël, "Optimisation de dispositifs FDSOI pour la gestion de la consommation et de la vitesse : application aux mémoire et fonctions logiques", Thesis, Université de Grenoble, 2011.

Cathelin, "Analog/RF design techniques in 28 nm FDSOI technology", SOI Industry Consortium, Sep. 22, 2017.

\* cited by examiner

SELF-BIASED OR BIASING TRANSISTOR(S) FOR AN ELECTRONIC VOLTAGE DIVIDER CIRCUIT, USING INSULATING THIN-FILM OR FDSOI (FULLY DEPLETED SILICON ON INSULATOR) TECHNOLOGY

CROSS-REFERENCE TO RELATED APPLICATIONS

This application claims priority to foreign French patent application No. FR 1913861, filed on Dec. 6, 2019, the disclosure of which is incorporated by reference in its entirety.

FIELD OF THE INVENTION

The present invention relates to a voltage divider circuit comprising transistors on insulating thin film (or FDSOI transistors, for "Fully Depleted Silicon On Insulator"), and able to be used in various circuits, for example a clock generator circuit including a ring oscillator.

BACKGROUND

Ring oscillators comprise an odd number of inverters forming a loop. An oscillating signal is obtained naturally at the output of each inverter. Their oscillating frequency is based on the switching time of the inverters, and is therefore linked directly to the number of inverters in the loop. The greater the number of inverters, the more the oscillating frequency decreases. The switching time of an inverter depends on various parameters, notably its supply voltage, its temperature, and this switching time may vary from one inverter to another owing to technological dispersions. The oscillating frequency is therefore strongly dependent on these parameters and may be difficult to control and stabilize.

To solve this problem, the prior art discloses ring oscillators comprising a circuit for generating a current/voltage supply, comprising a differential amplifier AO and a reference resistor $R_{ref}$, as shown in FIG. 1A.

The operating principle of this type of oscillator is that of slaving the intrinsic resistance (resulting from the inverters I1, I2 and I3, which may be likened to switching capacitors) of the string of inverters I1, I2, I3 to the reference resistance $R_{ref}$. The reference resistance $R_{ref}$ is fixed. The intrinsic resistance is then equal to the reference resistance $R_{ref}$ since the potentials $V_{ro}$ and $V_{res}$ are identical and the currents $i_{res}$, $i_{ro}$ flowing in the two branches $B_{res}$ and $B_{ro}$ are identical.

This type of oscillator oscillates at a frequency f dependent on the intrinsic resistance, and therefore on the reference resistance $R_{ref}$, on an equivalent capacitance C representing the switching of the inverters I1, I2 and I3 and on a parameter n representing the number of inverters in the loop, such that $f=1/(n \times C \times R_{ref})$.

However, for low-power oscillators, it is necessary to use a high-value reference resistor $R_{ref}$ (approximately 10 to 100 MΩ), since the potentials $V_{res}$ and $V_{ro}$ at the input of the amplifier AO are a few hundred millivolts and the currents are as low as possible for consumption reasons. The resistor $R_{ref}$ is therefore bulky and costly in terms of silicon surface. For example, for a voltage $V_{ro}=V_{res}=500$ mV and a current i of 100 nA, it will be necessary to use a resistor $R_{ref}$ of 5 MΩ. The resistor $R_{ref}$ will therefore be bulky and will in practice constitute virtually 80% of the silicon surface of the oscillator.

This architecture requires a compromise between oscillating frequency, consumed power and silicon surface of the reference resistor $R_{ref}$ in a low-power application (approximately 10 to 50 nW).

Moreover, one drawback of the oscillator circuit shown in FIG. 1 is that it is difficult in practice to make it insensitive to temperature variations. If the value of the reference resistor varies as a function of temperature, then the frequency of the oscillator will also vary. Using such an oscillator therefore requires using resistors that are only slightly or not temperature-sensitive if it is not desired to cause variations in the oscillating frequency. This limits the implementation options for the resistors and may lead to an extra surface cost for producing such resistors insensitive to temperature variations. It is furthermore rarely possible to have a temperature-compensated resistor, notably in FDSOI technologies.

More generally, this problem in terms of bulk of the silicon surface also arises in any application using a reference resistor, for example for reference current generators or reference voltage generators or more generally for any analogue voltage/current conversion system implemented in current generators, analogue-to-digital converters or oscillators.

FIG. 1B shows one example of a circuit for generating a reference current. The reference voltage $V_{ref}$ used in such a circuit is generally supplied by a "bandgap" circuit delivering a "high" voltage (conventionally 1.2 V). If it is also desired to have low electrical consumption, it is necessary for the current flowing in the resistor to be as low as possible. Thus, just like for the oscillator, it is necessary for the resistor to have a high value. It will furthermore be noted that this type of circuit also requires the use of a resistor insensitive to temperature variations if it is desired to obtain a generated reference current that is invariable in terms of temperature.

SUMMARY OF THE INVENTION

The invention aims to rectify the abovementioned drawbacks of the prior art by proposing an electronic voltage divider circuit produced using FDSOI technology (transistor on insulating thin film).

According to the invention, this aim is achieved by virtue of the clever use of the back-gate biases of FDSOI transistors of a circuit usually used to form a current source.

One subject of the invention is therefore an electronic voltage divider circuit comprising at least two FDSOI transistors on insulating thin film of a first type connected to a first supply potential and arranged in a current mirror structure and two FDSOI transistors on thin film of a second type and an electrical load of non-zero impedance, the transistors each having a front-face main gate and a back-face control gate, a drain of a first transistor of the second type being connected to the drain of a first transistor of the first type, a drain of a second transistor of the second type being connected to the drain of a second transistor of the first type, the drain of the first transistor of the second type being connected to the front-face gate of this same transistor, the front-face gates of the first and second transistors of the second type being connected to one another, the source of the first transistor of the second type being connected to a second supply potential and said load of non-zero impedance being placed between the source of the second transistor of the second type and said second supply potential, characterized in that the back-face gates of the first and second transistors of the second type are connected to an external circuit applying a non-zero input voltage between these two back-face gates, such that the back-face gate of the first transistor of the second type is brought to a potential lower than that of the back-face gate of the second transistor of the second type if these two transistors are of nMOS type, and that the back-face gate of the first transistor of the second type is brought to a potential greater than that of the back-face gate of the second transistor of the second type if these two transistors are of pMOS type, as a result of which the voltage across the terminals of said load constitutes an output voltage equal to a fraction of the input voltage.

Another subject of the invention is an electronic system comprising such an electronic circuit and comprising a third transistor of the first type of which the source is connected to the first supply potential, the gate being connected to the gates of the first and second transistors of the first type, and the drain being connected to a node connected to a load circuit.

Particular embodiments of the electronic voltage divider circuit and of the electronic system are the subject matter of the dependent claims.

BRIEF DESCRIPTION OF THE DRAWINGS

Other features, details and advantages of the invention will become apparent upon reading the description with reference to the appended figures, which are given by way of example and in which, respectively.

DETAILED DESCRIPTION

Figure 2:
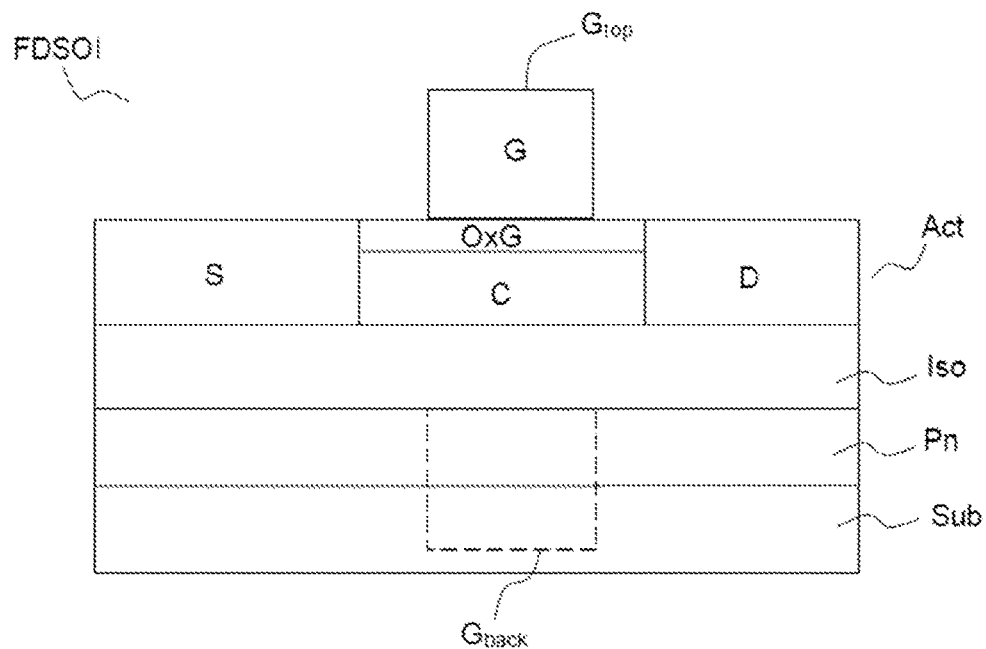
FIG. 2 shows an FDSOI transistor according to the prior art.

FIG. 2 shows the internal structure of an FDSOI transistor (transistor formed on an insulating thin film). The FDSOI transistor comprises a layer of a p-type silicon substrate Sub, a buried layer of an insulating material Iso, also called BOX, separated from the substrate Sub by a ground plane PM. The insulating layer Iso is surmounted by an active silicon layer Act in which a source S, a channel C and a drain D are placed. The ground plane PM (or well NWELL or PWELL depending on its doping) makes it possible to improve the electrostatic control of the transistor by limiting the penetration of the electric fields that are generated by the drain D and the source S under the channel C. The channel C is covered by a gate oxide layer OxG. The gate oxide OxG is surmounted by a metal gate G. The FDSOI transistor has a front-face gate Gtop and a back-face gate $G_{back}$. The front-face gate $G_{top}$ is the main gate for choosing the operating mode of the transistor (off, on). The back-face gate Gback for its part forms a control gate, the voltage applied to this back gate making it possible to vary the operating characteristics of the transistor, notably its threshold voltage.

Generally speaking, it is possible to vary the threshold voltage $V_{th}$ of FDSOI transistors by acting on the n or p doping of the well PM, on the connection metal of the gate and on the well voltage with respect to the source voltage applied to the transistor. To provide various types of transistor (different threshold voltage $V_{th}$), the manufacturing method is applied to the connection metal of the gate and to the doping of the well (n or p). A transistor with a low $V_{th}$, called LVT ("low threshold voltage") transistor, will have a relatively low voltage $V_{th}$ (of the order of 400 to 450 mV), and a transistor with a high $V_{th}$, called RVT ("regular threshold voltage") transistor, will have a relatively higher voltage $V_{th}$ (of the order of 500 to 550 mV).

When using transistors, the threshold voltage $V_{th}$ of the transistors is modified dynamically by modifying the voltage difference between the well and the source, thereby advantageously making it possible to obtain lower threshold voltages $V_{th}$ with LVT transistors (conventionally used to accelerate its speed) and to obtain higher threshold voltages $V_{th}$ with RVT transistors (conventionally used to control and limit static losses). Specifically, a ground plane PM of the same type as the source S and the drain D makes it possible to obtain an FDSOI transistor having a low threshold voltage value $V_{th}$, whereas a ground plane PM of a type different from the source S and the drain D makes it possible to obtain an FDSOI transistor having a high threshold voltage value $V_{th}$.

An LVT nMOS FDSOI transistor therefore has a drain D and a source S that are n-doped and an n-doped ground plane PM (that is to say an n-doped well NWELL), while an RVT nMOS transistor has a drain D and a source S that are n-doped and a p-doped ground plane PM (that is to say a p-doped well PWELL).

An LVT pMOS FDSOI transistor has a drain D and a source S that are p-doped and a p-doped ground plane PM (that is to say a p-doped well PWELL), while an RVT pMOS FSDOI transistor has a drain D and a source S that are p-doped and an n-doped ground plane PM (that is to say an n-doped well NWELL).

A detailed description of the various transistor implementation options showing higher or lower voltage threshold ranges is given in patent EP2415079 in the name of the Applicant.

Figure 3:
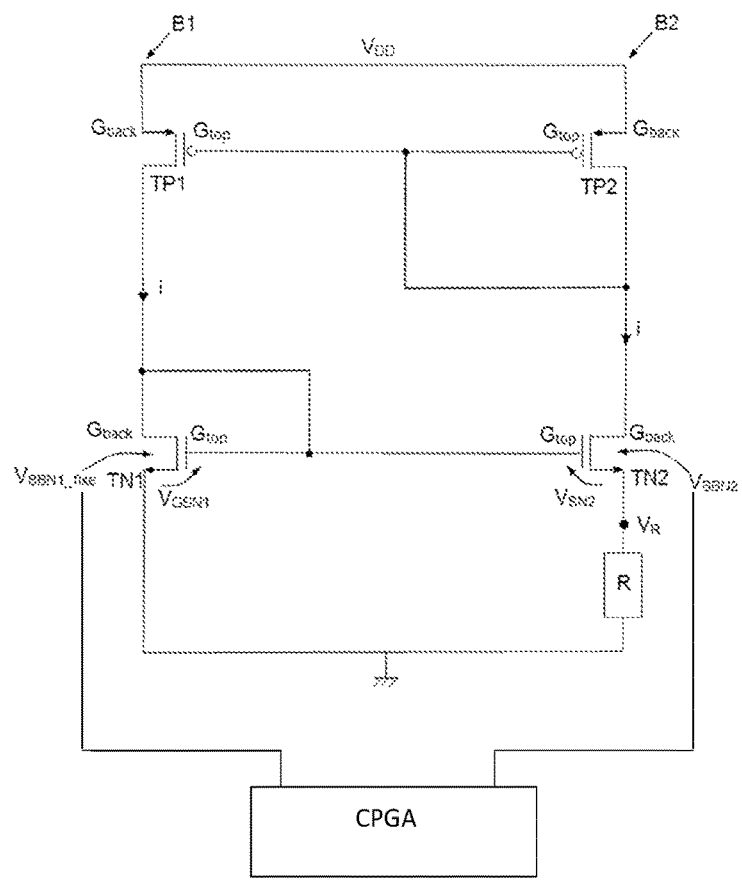
FIG. 3 shows an electronic circuit for generating a reference voltage according to a first embodiment of the invention.

FIG. 3 shows an electronic voltage divider circuit according to a first embodiment of the invention. Two pMOS FDSOI transistors TP1 and TP2 are connected to one another so as to form a current mirror. The source of the transistor TP1 and the source of the transistor TP2 are connected to one and the same supply potential $V_{DD}$, the front-face gate $G_{top}$ of the transistor TP1 is connected to the front-face gate of the transistor TP2 and the front-face gate of the transistor TP2 is connected to the drain of the transistor TP2.

It will be considered that the transistors TP1 and TP2 are identical, and therefore their W/L ratios are identical, where W is the width of the channel and L is the length of the front-face gate $G_{top}$ of each of the transistors. The current mirror forms two branches B1 and B2 in which one and the same electric current i flows.

This current mirror is connected to a pair of nMOS FDSOI transistors TN1 and TN2. The drain of the transistor TP1 is connected to the drain of the transistor TN1 and the drain of the transistor TP2 is connected to the drain of the transistor TN2. The source of the nMOS transistor TN1 is connected to an electrical ground.

A resistor R is placed between the source of the transistor TN2 and the electrical ground. The drain of the transistor TN1 is connected to the front-face gate $G_{top}$ of the transistor TN1 and the two front-face gates $G_{top}$ of the transistors TN1 and TN2 are connected to one another.

The back-face gates $G_{back}$ of the four FDSOI transistors TN1, TN2, TP1 and TP2 are biased by an "external" circuit CPGA. More specifically, the back gates Gback of the transistors TN1 and TN2 are respectively biased at potentials $V_{BBN1}$ and $V_{BBN2}$, while the back gates $G_{back}$ of the other transistors TP1 and TP2 are kept at a constant potential, equal in this example to the ground potential. As will be understood upon reading the explanations below, in order for the circuit to be functional (for a current to flow in the branches), it is necessary for the potentials $V_{BBN2}$ and $V_{BBN1}$ to be different, in practice significantly different, and for them to be such that $V_{BBN2} > V_{BBN1}$.

$V_R$ will be used to denote the potential of the source of the transistor TN2 (corresponding to the voltage across the terminals of the resistor R), and this potential $V_R$ has the value i×R, i being the current flowing in the two branches B1 and B2.

The capability of a transistor will also be denoted $\beta = (W/L) \times \mu \times C_{ox}$, where (W/L) is the ratio between the width W and the length L of the channel of the transistor, p is the mobility of the charge carriers and $C_{ox}$ is the gate oxide capacitance of the transistor.

For the transistor TN1, it may be written that the current i is equal to:

$$i = \beta_{TN1} J_{D0} \exp\left(\frac{V_{GTN1} - V_{ThTN1}}{nV_T}\right)\left(e^{-\frac{V_{STN1}}{V_T}} - e^{-\frac{V_{DTN1}}{V_T}}\right) \quad (1)$$

Where $\beta_{TN1}$ is the capability of the transistor TN1, $J_{D0}$ is a constant representing the saturation threshold of the transistors, n is the slope factor, $V_{GTN1}$ is the front-face gate $G_{top}$ potential of the transistor TN1, $V_{ThTN1}$ is the threshold voltage of the transistor TN1, $V_T$ is the thermal voltage of the transistors, $V_{STN1}$ is the source potential of the transistor TN1 and $V_{DTN1}$ is the drain potential of the transistor TN1.

For the transistor TN2, it may also be written that the current i is equal to:

$$i = \beta_{TN2} J_{D0} \exp\left(\frac{V_{GTN2} - V_{ThTN2}}{nV_T}\right)\left(e^{-\frac{V_{STN2}}{V_T}} - e^{-\frac{V_{DTN2}}{V_T}}\right) \quad (2)$$

Where $\beta_{TN2}$ is the capability of the transistor TN2, $V_{GTN2}$ is the front-face gate $G_{top}$ potential of the transistor TN2, $V_{ThTN2}$ is the threshold voltage of the transistor TN2, $V_{STN2}$ is the source potential of the transistor TN2 and $V_{DTN2}$ is the drain potential of the transistor TN2.

Equation (1) may be developed in order to obtain:

$$i = \beta_{TN1} J_{D0} \exp\left(\frac{V_{GTN1} - V_{ThTN1}}{nV_T}\right)\left(1 - e^{\frac{V_{STN1}}{V_T} - \frac{V_{DTN1}}{V_T}}\right) e^{-\frac{V_{STN1}}{V_T}} \quad (3)$$

Now, the terms $$e^{-\frac{V_{STN1}}{V_T}} - e^{-\frac{V_{DTN1}}{V_T}} \text{ and } e^{-\frac{V_{STN2}}{V_T}} - e^{-\frac{V_{DTN2}}{V_T}}$$

are virtually identical between the transistor TN1 and the transistor TN2 with a cascode assembly (described below), and very close without a cascode assembly. It is therefore possible to combine equations (2) and (3) to obtain the following development:

$$\beta_{TN1} J_{D0} \exp\left(\frac{V_{GTN1} - V_{ThTN1}}{nV_T}\right) e^{-\frac{V_{STN1}}{V_T}} = \quad (4)$$

$$\beta_{TN2} J_{D0} \exp\left(\frac{V_{GTN2} - V_{ThTN2}}{nV_T}\right) e^{-\frac{V_{STN2}}{V_T}}$$

Since the source of the transistor TN1 is connected to the electrical ground, the potential $V_{STN1}$ of the source of the transistor TN1 is zero. In addition, the potential $V_{STN2}$ of the source of the transistor TN2 has the value $V_R$. Equation (4) becomes:

$$\beta_{TN1} \exp\left(\frac{V_{GTN1} - V_{ThTN1}}{nV_T}\right) = \beta_{TN2} \exp\left(\frac{V_{GTN2} - V_{ThTN2}}{nV_T}\right) e^{-\frac{V_R}{V_T}} \quad (5)$$

$$\frac{\beta_{TN1}}{\beta_{TN2}} = \exp\left(-\frac{V_{GTN1} - V_{ThTN1}}{nV_T}\right) \exp\left(\frac{V_{GTN2} - V_{ThTN2}}{nV_T}\right) e^{-\frac{V_R}{V_T}} \quad (6)$$

$$\ln\left(\frac{\beta_{TN1}}{\beta_{TN2}}\right) = -\frac{V_{GTN1} - V_{ThTN1}}{nV_T} + \left(\frac{V_{GTN2} - V_{ThTN2}}{nV_T}\right) - \frac{V_R}{V_T} \quad (7)$$

$$\ln\left(\frac{\beta_{TN1}}{\beta_{TN2}}\right) = \frac{V_{GTN2} - V_{GTN1} + V_{ThTN1} - V_{ThTN2} - nV_R}{nV_T} \quad (8)$$

$$V_R = V_T \ln\left(\frac{\beta_{TN2}}{\beta_{TN1}}\right) + \frac{V_{GTN2} - V_{GTN1}}{n} + \frac{V_{ThTN1} - V_{ThTN2}}{n} \quad (9)$$

Since the gates of the transistors TN1 and TN2 are connected to one another, their potential difference ($V_{GTN2} - V_{GTN1}$) is zero. The difference between the threshold voltages of the two transistors TN1 and TN2 will be denoted $\Delta V_{th}$, where $\Delta V_{th} = V_{ThTN2} - V_{ThTN1}$. Equation (9) therefore becomes:

$$V_R = V_T \ln\left(\frac{\beta_{TN2}}{\beta_{TN1}}\right) - \frac{\Delta V_{th}}{n} \quad (10)$$

Now, according to the thesis by Alyssa Bonnoit, "Reducing power using body biasing in microprocessors with dynamic voltage/frequency scaling", the thesis by Jean-Philippe Noel, "Optimisation de dispositifs FDSOI pour la gestion de la consommation et de la vitesse: application aux mémoire et fonctions logiques" [Optimization of FDSOI devices for managing consumption and speed: application to memory and logic functions] and the presentation by Andreia Cathelin "Analog/RF design techniques in 28 nm FDSOI technology" from 2017 at the SOI Industry Consortium, it may be written that $\Delta V_{th} = \alpha(V_{BBN1\_fixe} - V_{BBN2} + V_R)$, where a is a real.

Equation (10) therefore becomes:

$$V_R = V_T \ln\left(\frac{\beta_{TN2}}{\beta_{TN1}}\right) - \frac{\alpha(-V_{BBN2} + V_R + V_{BBN1\_})}{n} \quad (11)$$

$$V_R\left(\frac{n+a}{n}\right) = V_T \ln\left(\frac{\beta_{TN2}}{\beta_{TN1}}\right) - \frac{\alpha V_{BBN1\_}}{n} + \frac{\alpha(V_{BBN2})}{n} \quad (12)$$

$$V_R = V_T \frac{n}{n+\alpha} \ln\left(\frac{\beta_{TN2}}{\beta_{TN1}}\right) + \frac{\alpha(V_{BBN2} - V_{BBN1\_})}{n+\alpha} \quad (13)$$

It is observed from equation (13) that the potential $V_R$ is linked to the potential difference $V_{BBN2}-V_{BBN1}$ by a linear relationship in the second term of the equation.

The term $$V_T \frac{n}{n+\alpha} \ln\left(\frac{\beta_{TN2}}{\beta_{TN1}}\right)$$

is zero in front of the term $$\frac{\alpha(V_{BBN2} - V_{BBN1\_})}{n+\alpha}$$

if the W/L ratios of the transistors TN1 and TN2 are identical. Equation (13) then becomes:

$$V_R = \frac{\alpha(V_{BBN2} - V_{BBN1\_})}{n+\alpha} \quad (14)$$

This equation 14 makes it possible to clearly observe that the proposed circuit readily makes it possible to form a voltage divider, the division factor being equal to $$\frac{\alpha}{n+\alpha}.$$

Generically speaking, it is observed that equation (13) consists of two terms A+B, where A and B are defined as follows:

$$A = V_T \frac{n}{n+\alpha} \ln\left(\frac{\beta_{TN2}}{\beta_{TN1}}\right)$$

$$B = \frac{\alpha(V_{BBN2} - V_{BBN1\_})}{n+\alpha}$$

By choosing different transistors TN1 and TN2 (therefore having different W/L ratios), it is possible to introduce temperature compensation, as is explained below. However, even if the W/L ratios of the transistors TN1 and TN2 are chosen to be different, in practice slightly different (for example 10% or even 20% at most, the percentage being understood with respect to the greatest W/L value), the first term A will often be lower than the term B if the potentials $V_{BBN2}$ and $V_{BBN1}$ are significantly different. It will be noted that the term A may be positive or negative depending on whether the transistor TN2 is respectively larger or smaller than the transistor TN1.

By way of comparison, if the circuit of FIG. 3 were to be used as in the prior art to form a current source, with identical back-gate potentials for $V_{BBN2}$ and $V_{BBN1}$, there would be a ratio of 1 to 8 between the sizes of the transistors TN1 and TN2 so as to have a sufficient voltage across the terminals of the resistor. The term B would then be equal to 0 and the voltage $V_R$ would be obtained only using the term A, using very significantly different geometries for TN1 and TN2 so that the term A is not too small. On the other hand, in a voltage divider circuit according to the present invention, more preference will be given to the term B by virtue of the input voltage, expressed by different potentials $V_{BBN2}$ and $V_{BBN1}$. The term A is introduced only if it is desired to compensate temperature variations of the resistor. By way of example, for one and the same voltage $V_R$ across the terminals of the resistor, there is a ratio of 11/12 (for understanding: the transistors TN1 and TN2 have respectively 11 and 12 elementary fingers) with the circuit of FIG. 3, with an input voltage of 2 V (difference between the potentials $V_{BBN2}$ and $V_{BBN1}$).

In addition, if one of the potentials $V_{BBN1}$ or $V_{BBN2}$ is equal to the standard potential $V_{SS}$ defining the electrical ground, it is possible to simplify equation (14), and consider that the term $$\frac{\alpha V_{BBN(2\ ou\ 1)}}{n+\alpha}$$

is virtually zero.

This abovementioned development is applied in the case of operation of the transistors TN1 and TN2 in weak inversion mode, in other words in the case of transistors TN1 and TN2 in the on state below the threshold.

The proposed circuit therefore makes it possible to lower the voltage $V_R$ across the terminals of the resistor R with respect to the input voltage equal to $V_{BBN2}-V_{BBN1}$, while still retaining a low value of the current i in the two branches B1 and B2 and a resistor value R that makes it possible to minimize the bulk in terms of silicon surface.

It is possible to adopt the same reasoning for transistors TN1 and TN2 in strong inversion mode, where $V_{DS} > V_{GS} - V_T$, (and $V_{GS} > V_T$) where $V_{DS}$ is the voltage between the drain and the source of a transistor, $V_{GS}$ is the voltage between the front gate and the source of the same transistor and $V_T$ is the thermal voltage of the transistor. The current in the transistors TN1 and TN2 is written as follows:

$$i = \frac{\beta}{2}(V_{GS} - V_{th})^2 (1 + \lambda V_{DS}) \quad (15)$$

Where $\beta$ is the capability of the transistor, $V_{GS}$ is the voltage between the gate and the source of the transistor, $V_{th}$ is the threshold voltage of the transistor, $V_{DS}$ is the voltage between the drain and the source of the transistor and $\lambda$ is the modulation coefficient of the channel length.

The current i is identical in both transistors TN1 and TN2 due to the current mirror structure, and it is therefore possible to write:

$$\beta_{TN1}(V_{STN1}-V_{GTN1}-V_{ThTN1})^2(1+\lambda V_{DSTN1}) = \beta_{TN2}$$
$$(V_{STN2}-V_{GTN2}-V_{ThTN2})^2(1+\lambda V_{DSTN2}) \quad (16)$$

For the same reasons as above, it is possible to neglect the two terms $(1+\lambda V_{DSTN2})$ and $(1+\lambda V_{DSTN1})$ and obtain:

$$V_R = \frac{1}{\alpha+1}\frac{T}{T_o}\sqrt{\frac{2I}{\mu_o C_{ox}\frac{W_1}{L_1}}}\left(1 - \frac{1}{\sqrt{K}}\right) + \frac{\alpha}{\alpha+1}(V_{BBN2} - V_{BBN1}) \quad (17)$$

As above, equation (17) may be written in the form $V_R = A+B$ where $$A = \frac{1}{\alpha+1}\frac{T}{T_o}\sqrt{\frac{2I}{\mu_oC_{ox}\frac{W_1}{L_1}}}\left(1-\frac{1}{\sqrt{K}}\right)$$

$$B = \frac{\alpha}{\alpha+1}(V_{BBN2} - V_{BBN1\_})$$

The ratio between the potential $V_R$ and the difference $V_{BBN2}-V_{BBN1}$ is therefore substantially constant, regardless of the operating state of the transistors TN1 and TN2, since n is close to 1 in FDSOI technology (around 1.2 to 1.6). This may be generalized by inverting the structure as described more precisely with reference to FIG. 6.

According to one possible embodiment, the transistor TN2 has a front-face gate $G_{top}$ width greater than that of the transistor TN1 (or more precisely W2/L2>W1/L1), thereby making it possible to obtain an effect "proportional to temperature" (PTAT, or "Proportional to Absolute Temperature") on the current i flowing in the resistor R due to the values of voltages between the gate and the source of the transistors, which increase with temperature. This is explained by the fact that $V_{GS1}-V_{GS2}=V_R$, therefore, if the voltages $V_{GS}$ increase, then $V_R$ also increases, and therefore so does the current i. This makes it possible to compensate a positive temperature coefficient of the resistor R, which leads to an effect "inversely proportional to temperature" (CPTAT, or "Conversely Proportional to Absolute Temperature") on the current i. The two effects CPTAT and PTAT therefore compensate one another, and the ratio between $V_R$ and $V_{BBN2}-V_{BBN1\_fixe}$ remains stable in terms of temperature. This is also explained by the fact that the coefficient A in formula (14) or (17) as a function of $V_T$ is positive. Since $V_T$ increases with temperature, the variation in A and therefore in $V_R$ will be positive if $\beta_{TN2} > \beta_{TN1}$ therefore if the transistor TN2 is larger than the transistor TN1.

In the less common case in which the resistor that is used has a negative temperature coefficient, leading to a PTAT effect on the current i, it is possible to compensate this PTAT effect through a CPTAT effect by inversely unbalancing the geometric ratios of the transistors TN2 and TN1, taking W2/L2>W1/L1. This is also explained by the fact that the coefficient A will be negative in this case. Since $V_T$ increases with temperature, the variation in A and therefore in $V_R$ will be negative if $\beta_{TN2} < \beta_{TN1}$, therefore if the transistor TN2 is smaller than the transistor TN1.

The circuit shown in FIG. 3 may be formed using LVT or RVT transistors. The choice of the type of LVT or RVT transistors for the transistors TN1 and TN2 depends on the contemplated application and on the technological manufacturing options for the FDSOI transistors, notably for forming wells Nwell/Pwell placed under the thin oxide layer and forming deep isolation wells for separating a well Pwell from the "solid" substrate, which is generally p-type. As is well known to a person skilled in the art, if the well Nwell or Pwell is biased at a voltage different from the substrate, and possibly from the deep well "Deep Nwell", it is necessary to ensure that the diodes present between the well/substrate or well/Deep Nwell are not conductive.

The voltage divider circuit may be used with input potentials, on $V_{BBN1}$ and $V_{BBN2}$, which are each fixed or variable.

The 2 input potentials, and therefore the input voltage, will be fixed if the voltage divider is used for example to generate the equivalent of a "low" reference voltage $V_R$ from a "high" reference voltage, for example supplied by a circuit commonly denoted by the name "bandgap", such a low reference voltage being able to be used, inter alia, in a reference current source circuit, as is described below with reference to FIG. 10.

The input voltage may be variable, for example by varying at least one of the two potentials. In the exemplary oscillator circuit described below, one of the potentials, $V_{BBN1}$, is fixed and the other potential, $V_{BBN2}$, may vary within a given range of values. If the divider circuit were to be connected for example to a sensor supplying a differential signal, the two potentials could be caused to fluctuate.

Regardless of the contemplated application of such a voltage divider circuit, the choice of LVT or RVT transistors will be guided primarily by the ease of implementation of the circuit. If at least one of the potentials is negative, it will be easier to use RVT nMOS transistors to be able to negatively bias the PWELL and isolate it from the grounded substrate through a deep well DeepNWELL. On the other hand, if the potentials are more positive, or very weakly negative (higher than −0.6 V), it will be possible to use LVT transistors, since it is possible to bias the well Nwell to these values without making the Nwell/Psubstrate diode conductive.

According to one possible embodiment, the transistors TN1, TN2, TP1 and TP2 are transistors comprising a plurality of "fingers", for example identical fingers; the transistor TN1 comprises X "fingers" and the transistor TN2 comprises X+K "fingers", where X and K are two integers, or vice versa if it is possibly desired for the transistor TN2 to be smaller than the transistor TN1.

The advantage of using FDSOI transistors is that of being able to access an expanded range of values in terms of bias potential $V_{BBN2}$ or $V_{BBN1}$ for the back gate Gback of the FDSOI transistor TN2 or TN1 (or possibly the 2 of them), and thus also of having an expanded range of values in terms of the threshold voltage $V_{th}$ of the transistor TN2 and/or TN1, as shown in the presentation by Andreia Cathelin "Analog/RF design techniques in 28 nm FDSOI technology" from 2017 given at the SOI Industry Consortium. This leads to a low factor α (equation (11)) and therefore makes it possible to more greatly reduce the potential $V_R$ (or voltage across the terminals of the resistor) with respect to the input voltage $V_{BBN2}-V_{BBN1}$, and thus to more advantageously limit the bulk of the resistor R on the silicon surface when it is desired to use a low-value bias current to limit its consumption.

Figure 4:
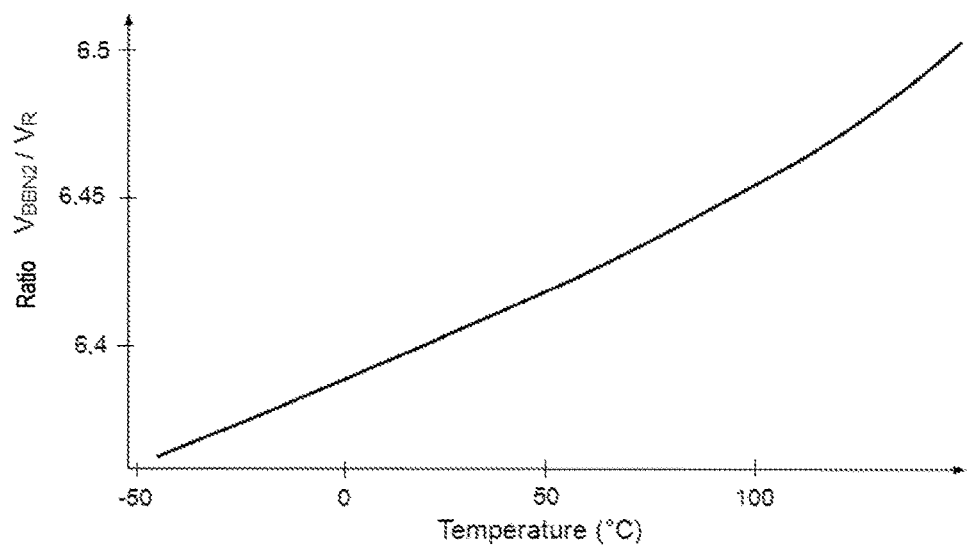
FIG. 4 and FIG. 5 show the ratio between two potentials as a function of temperature for two types of transistors of the circuit according to the first embodiment of the invention.

FIG. 4 shows results of simulations performed with the circuit of FIG. 3, in which the transistors TN1 and TN2 are of the same size and of GO1 LVT type, that is to say that their back-face insulator thickness makes it possible to withstand a voltage of approximately 1 V on the front gate $G_{top}$ of the transistor, and the resistor R does not have any temperature coefficient. The potential $V_{BBN1}$ in this example is equal to that of the ground, therefore zero. The ratio $$\frac{V_{BBN2}}{V_R} \sim \frac{n+\alpha}{\alpha}$$

is shown on the ordinate and the temperature of the circuit (therefore of all of the transistors in FIG. 3) is shown on the abscissa. It is observed that, for a temperature varying between −45° C. and 150° C., the ratio $$\frac{V_{BBN2}}{V_R} \sim \frac{n+\alpha}{\alpha}$$

varies between 6.36 and 6.5. It may therefore be considered that this ratio is insensitive to the temperature of the circuit. The ratio $$\frac{V_{BBN2}}{V_R} \sim \frac{n+\alpha}{\alpha}$$

varies far more greatly in terms of temperature if these simulations are performed with a resistor R having a temperature coefficient. It is for this reason that the transistors TN1 and TN2 advantageously have different W/L ratios in order to compensate the temperature variation.

The circuit proposed in FIG. 3 therefore makes it readily possible to form a voltage divider circuit, considering that $V_{BBN2}-V_{BBN1}$ is the input voltage and the voltage across the terminals of the load (equal in the present case to $V_R$) is the output voltage, obtained by dividing $V_{BBN2}$ by a factor $$\frac{n+\alpha}{\alpha} > 1$$

insensitive to temperature, and therefore to form a circuit for generating a reference voltage comprising a non-bulky reference resistor.

Figure 5:
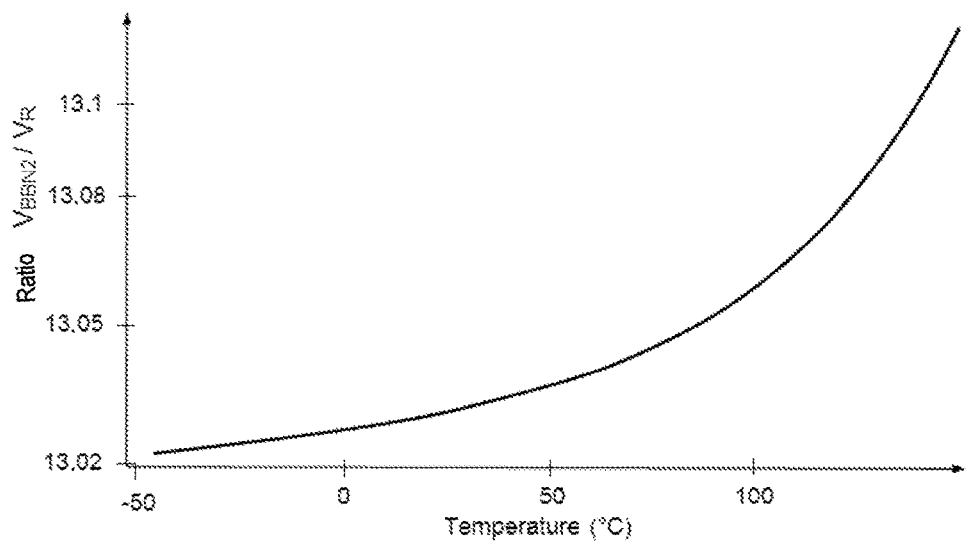

FIG. 5 shows results of simulations performed with the circuit of FIG. 3 in which the transistors TN1 and TN2 are still of the same size but of GO2 LVT type. They therefore have an insulator thickness that is twice as great (GO2 transistors), thereby allowing them to withstand a higher bias voltage on their front gate. The ratio $$\frac{V_{BBN2}}{V_R} \sim \frac{n+\alpha}{\alpha}$$

is shown on the ordinate and the temperature of the circuit from FIG. 3 is shown on the abscissa. It is observed that, for a temperature varying between −45° C. and 150° C., the ratio $$\frac{V_{BBN2}}{V_R} \sim \frac{n+\alpha}{\alpha}$$

varies between 13.02 and 13.12. It may therefore be considered that this ratio is insensitive to the temperature of the circuit, and, as above, that the circuit proposed in FIG. 3 makes it possible to form a voltage divider circuit that is temperature-insensitive and is able to adapt the division factor $$\frac{V_{BBN2}}{V_R} \sim \frac{n+\alpha}{\alpha}$$

virtue of the thickness of the layer of thin oxide, of BOX oxide and of the silicon film, and thus to have a non-bulky reference resistor in terms of silicon surface.

Figure 6:
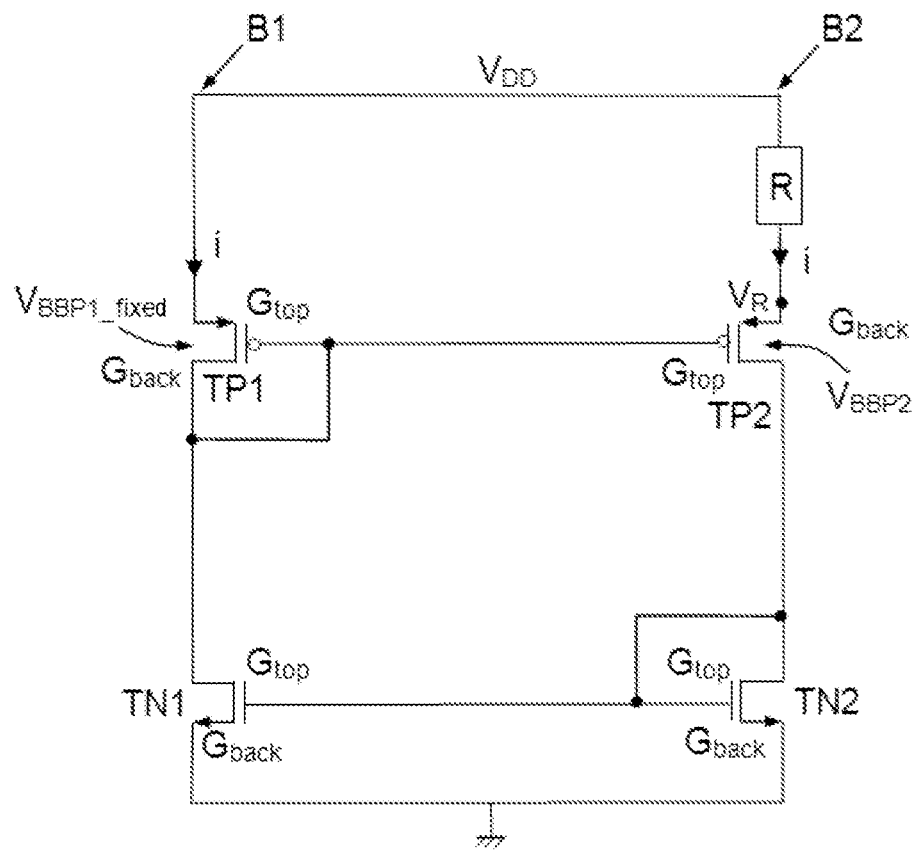
FIG. 6 shows an electronic circuit according to a second embodiment of the invention.

FIG. 6 shows a second embodiment. Two nMOS FDSOI transistors TN1 and TN2 are connected to one another so as to form a current mirror. This current mirror is connected to a pair of pMOS FDSOI transistors TP1 and TP2. The source of the pMOS transistor TP1 is connected to the potential $V_{DD}$, and the drains of the two transistors TP1 and TP2 are connected respectively to the drains of the nMOS transistors TN1 and TN2. The sources of the nMOS transistors TN1 and TN2 are connected to an electrical ground. A resistor R is placed between the source of the transistor TP2 and the potential $V_{DD}$. The front-face gate of the transistor TN2 is connected to the source of the transistor TN2 and the two front-face gates of the transistors TN1 and TN2 are connected to one another. The front-face gate of the transistor TP1 is connected to the source of the transistor TP1 and the gates of the transistors TP1 and TP2 are connected to one another. It will be considered that the transistors TN1 and TN2 are identical, and therefore that their W/L ratios are identical. The current i flowing in the two branches B1 and B2 formed by the current mirror is identical.

The back gates of the four FDSOI transistors TN1, TN2, TP1 and TP2 are biased by an external circuit, not shown, analogous to the circuit CPGA from FIG. 3. More specifically, the back gates of the transistors TP1 and TP2 are respectively biased at potentials $V_{BBP1}$ and $V_{BBP2}$, while the back-face gates of the other transistors TN1, TN2 are kept at a constant potential, equal in this example to the ground. As will be understood upon reading the explanations below, in order for the circuit to be functional (for a current to flow in the branches), it is necessary for the potentials VBBP2 and VBBP1 to be different, in practice significantly different, and for them to be such that $V_{BBP2} < V_{BBP1}$.

$V_R$ will be used to denote the potential between the source of the transistor TP2 and the resistor R. The voltage across the terminals of the resistor R, equal to $V_{DD}-V_R$, has the value i×R, where i is the current flowing in the two branches B1 and B2.

It is possible to apply the same reasoning as that given for the circuits in the previous figures, specifically that the current i arriving on the source of the transistor TP1 may be written as follows:

$$i \sim \beta_{TP1} J_{D0} \exp\left(\frac{V_{GTP1} - V_{ThTP1}}{nV_T}\right) e^{-\frac{V_{STP1}}{V_T}} \quad (23)$$

And the current i arriving on the source of the transistor TP2 may be written as follows:

$$i \sim \beta_{TP2} J_{D0} \exp\left(\frac{V_{GTP2} - V_{ThTP2}}{nV_T}\right) e^{-\frac{V_{STP2}}{V_T}} \quad (24)$$

By combining equations (23) and (24) and based on the abovementioned thesis by Jean-Philippe Noel, a linear relationship linking the potentials $V_R$ and $V_{BBP2}$ is obtained:

$$Vdd - V_R = V_T \frac{n}{n+\alpha} \ln\left(\frac{\beta_{TP2}}{\beta_{TP1}}\right) + \frac{\alpha(V_{BBP1} - V_{BBP2})}{n+\alpha} \quad (25)$$

In order, as above, to have a voltage across the terminals of the resistor R (equal to $V_{DD}-V_R$), it is necessary, in this complementary case in which the input voltage is applied between the back gates of the pMOS, for $V_{BBP2}$ to be less than $V_{BBP1}$, and a voltage divider circuit is readily obtained. This thus makes it possible to reduce the value of the resistor R while still having a low current i value and a high input voltage $V_{BBP1}-V_{BBP2}$.

Just as above, equation (25) may be written in the form A+B where:

$$A = V_T \frac{n}{n+\alpha} \ln\left(\frac{\beta_{TP2}}{\beta_{TP1}}\right)$$

$$B = \frac{\alpha(V_{BBP1} - V_{BBP2})}{n+\alpha}$$

It is then possible to compensate any variation in resistance as a function of temperature by proceeding as described above, by virtue of the presence of the term A in the formula giving the voltage $V_{DD}-V_R$.

Moreover, without reiterating all of the developments, in saturated state, an equation (26) equivalent to equation (17) is obtained, in this case too with two terms A and B as described above.

$$V_{dd} - V_R = \frac{\alpha}{\alpha+1}(V_{BBP1} - V_{BBP2\_}) \quad (26)$$

Figure 8:
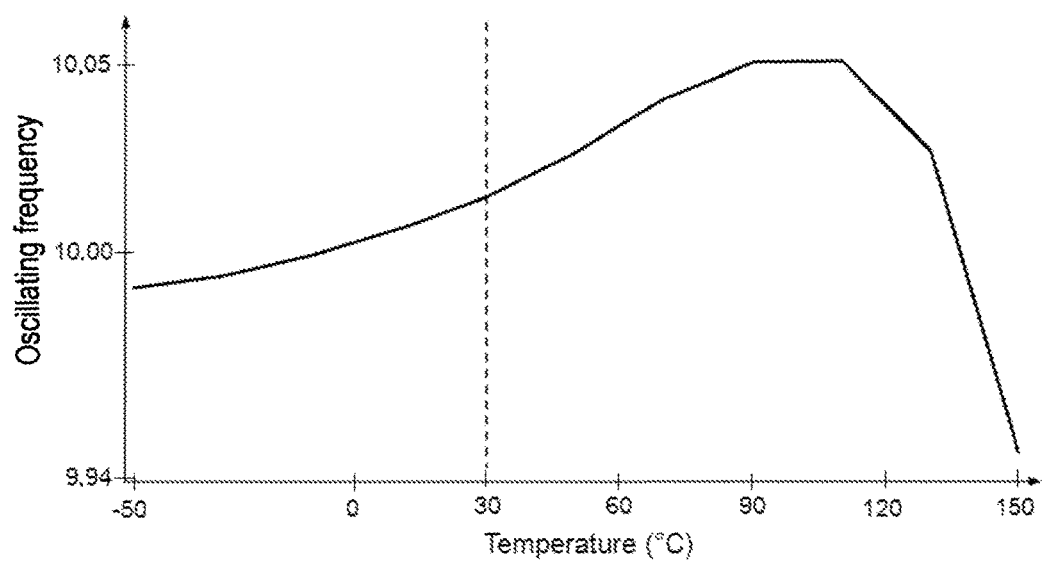
FIG. 8 shows the oscillating frequency as a function of the temperature of the oscillator according to the first embodiment of the invention determined by simulation.
Figure 9:
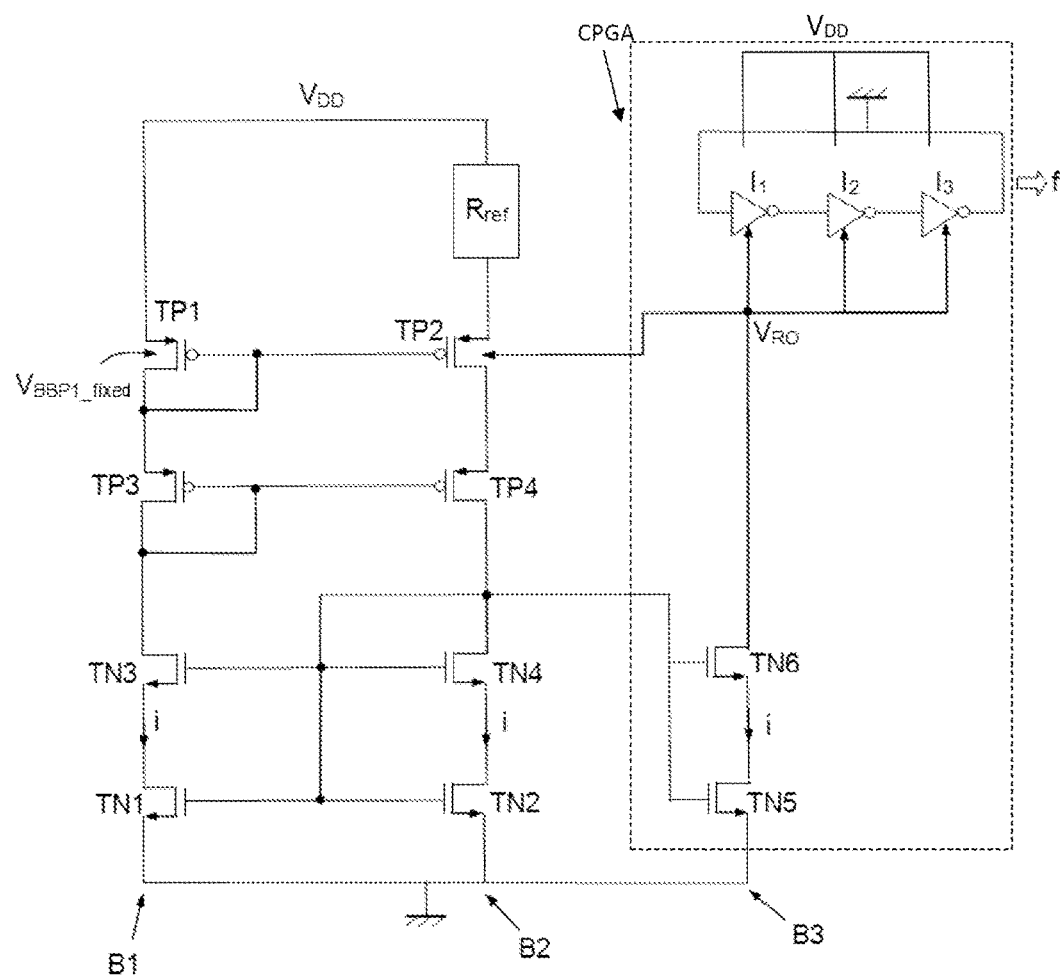
FIG. 9 shows a ring oscillator according to a second embodiment of the invention.

The circuits that are shown make it possible to form a voltage divider with a low reference resistance and a low current i. These circuits may have various applications. A first application, described with reference to FIGS. 7 to 9, is a circuit for generating a clock signal using a ring oscillator.

Figure 7:
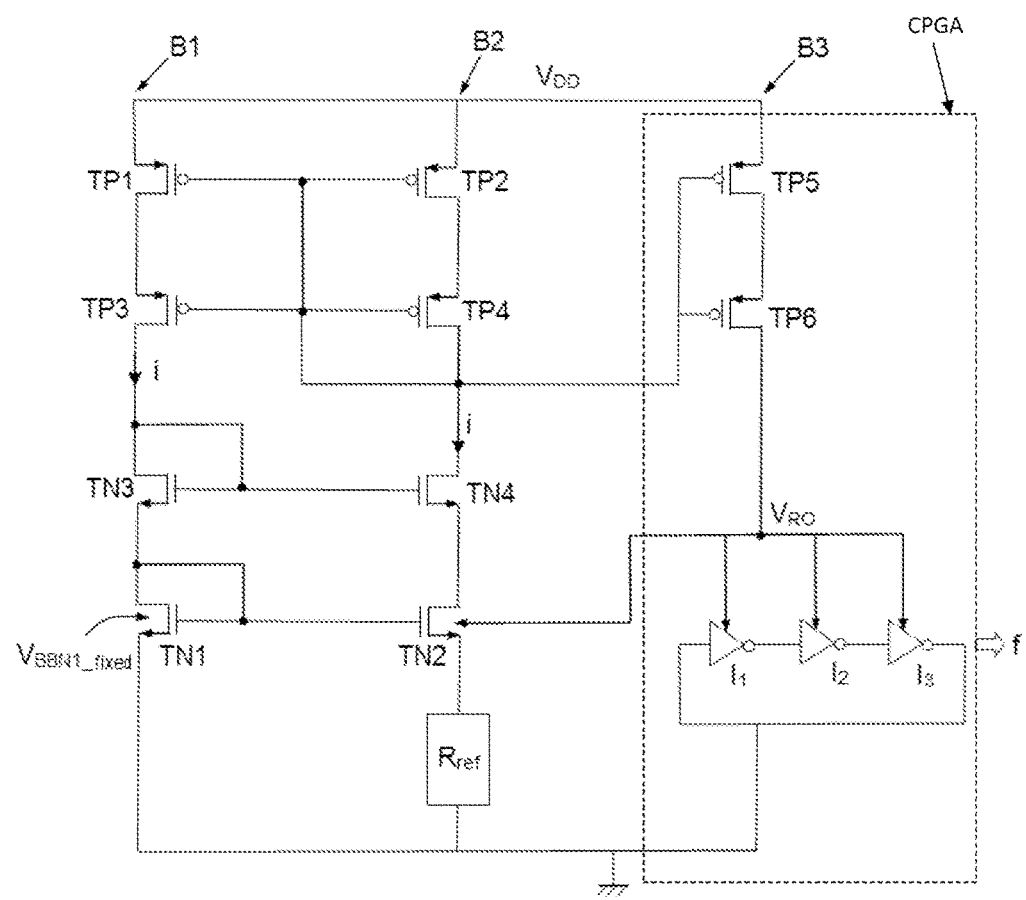
FIG. 7 shows a ring oscillator according to a first embodiment of the invention.

FIG. 7 shows one example of such a clock generation circuit comprising a circuit delivering a voltage and a current to a ring oscillator. The oscillator comprises three inverters I1, I2 and I3 that are connected to one another so as to form a loop. More generally, the oscillator may comprise 2N+1 inverters, where N is a natural integer greater than 1.

By using the electronic circuits shown in the above figures as a reference voltage/current generator to supply the inverters, it is possible to have a voltage $V_{RO}$ across the terminals of the reference resistor of a few tens of millivolts and a low current i while still having low reference resistor $R_{ref}$ values. Specifically, by virtue of the voltage divider formed by the invention, it is possible to lower the voltage $V_R$ flowing in the reference resistor $R_{ref}$ and thus reduce the value thereof.

The circuit comprises the same components as those in the circuit from FIG. 3 and furthermore comprises a transistor TP5 connected to the transistors TP1 and TP2 so as to form a current mirror thus comprising three branches B1, B2 and B3 in which one and the same current i flows. The sources of the three transistors TP1, TP2 and TP5 are thus connected to one and the same potential $V_{DD}$, and their front-face gates are connected to one another.

The back-face gate of the transistor TN2 is connected to a "supply" node having a variable potential $V_{RO}$, which is the supply potential of the inverters I1, I2 and I3. This supply node is connected to the branch B3 of the current mirror, the inverters therefore being supplied with the current i flowing in the branch B3. The branch B3 and the three inverters therefore perform the role of the circuit CPGA in FIG. 4.

In this exemplary embodiment, the reference voltage circuit comprises transistors TN3, TN4, TP3, TP4 and TP6 configured in a cascode assembly with the transistors TN1, TN2, TP1, TP2 and TP5 that are already present. As is known to a person skilled in the art, this assembly makes it possible to ensure virtual equality between the voltages VDS of the transistors of each current mirror. Thus, with reference to the abovementioned equations giving the value of the current i, it is possible to eliminate the components linked to the voltages VDS and to have an "ideal" voltage divider. The pMOS transistors TP3, TP4, TP6 and nMOS transistors TN3, TN4 are thus placed respectively in series with the pMOS transistors TP1, TP2, TP5 and the nMOS transistors TN1 and TN2. The supply node (potential $V_{RO}$) is thus connected to the drain of the pMOS transistor TP6.

The back-face gates of all of the transistors, except for the transistor TN2, are kept at a constant potential equal in this example to the ground.

The source of the transistor TP3 is connected to the drain of the transistor TP1, the source of the transistor TP4 is connected to the drain of the transistor TP2 and the source of the transistor TP6 is connected to the drain of the transistor TP5. The front-face gates of the transistors TP3 and TP4 are connected to one another. The front-face gates of the transistors TP5 and TP6 are connected to one another. The front-face gates of the transistors TP3 and TP4 are connected to the front-face gates of the transistors TP1 and TP2. The front-face gate of the transistor TP4 is connected to the drain of the transistor TP4 and the front-face gates of the transistors TP5 and TP6 are connected to the drain of the transistor TP4.

The drain of the transistor TN3 is connected to the drain of TP3 and the drain of TN4 is connected to the drain of TP4. The front-face gates of the transistors TN3 and TN4 are connected to one another. The drain of TN3 is connected to the front-face gate of the transistor TN3. The source of the transistor TN3 is connected to the drain of the transistor TN1 and the source of the transistor TN4 is connected to the drain of the transistor TN2.

Figure 1A:
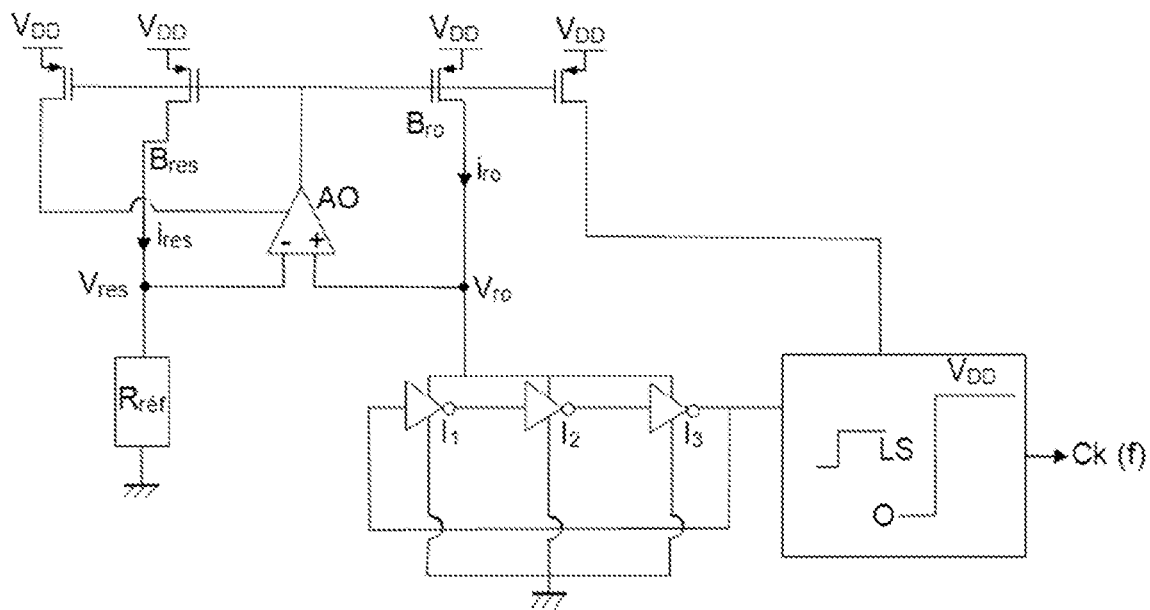
FIG. 1A, already described, shows a ring oscillator comprising a loop of inverters according to the prior art.

The back-face gates of all of the transistors, except for the transistor TN2, are kept at a constant potential that is equal in this example. The oscillating frequency f of this oscillator may be written as a function of the equivalent resistance of the ring oscillator, the oscillator constituting a "load" supplied by the branch B3; $f=1/(n*C*R_{equi})$. The current flowing through the reference resistor $R_{ref}$ is equal to that flowing through the equivalent resistance of the ring oscillator $R_{equi}$, thus $i=V_R/R_{ref}=V_{RO}/R_{equi}$. Furthermore, as described above, $V_{RO}=KBB*V_{Rref}$ where KBB>0. Thus, $V_R/R_{ref}=KBB*V_{Rref}/R_{equi}$, and $R_{equi}=KBB*R_{ref}$. The clock generation circuit that is shown forms a control loop for slaving the value of the equivalent resistance $R_{equi}$ to the value of the reference resistor multiplied by this factor KBB. A significant advantage of this clock generation circuit using a voltage divider according to the present invention in comparison with the clock generation circuit shown in FIG. 1 is that it requires a lower-value reference resistor than the desired equivalent resistance of the ring oscillator. Thus, since the ratio KBB may be large, easily between 5 and 10, it is possible to use a resistor 5 to 10 times smaller, and therefore a current and therefore a consumption 5 to 10 times smaller than that of the circuit from the prior art.

FIG. 8 shows the oscillating frequency f of the ring oscillator of the circuit from FIG. 7 as a function of temperature, determined by simulations. It is observed that the frequency f is insensitive to the temperature of the circuit, since it varies between 9.04 MHz and 10.06 MHz for a temperature varying between −50° C. and 150° C. This is explained by the fact that the resistance $R_{ref}$ decreases with temperature but, by having transistors TN1 and TN2 such that W2/L2>W1/L1, stability of the ratio between $V_{RO}$ and $V_R$ is achieved, and therefore stability of the oscillating frequency f over a wide temperature range is achieved.

FIG. 9 shows a clock generation circuit based on a ring oscillator according to another embodiment of the invention, complementary to the one shown in FIG. 7. The oscillator comprises three inverters I1, I2 and I3 that are connected to one another so as to form a loop. More generally, the oscillator may comprise 2N+1 inverters, where N is a natural integer greater than 1.

As above, use is made of a voltage divider circuit with a current mirror to supply the inverters I1, I2 and I3.

The oscillator thus comprises three nMOS transistors TN1, TN2 and TN5 connected to one another so as to form a current mirror comprising three branches B1, B2 and B3 in which one and the same current i flows. The sources of the three transistors TN1, TN2 and TN5 are thus connected to one and the same potential, which is here an electrical ground. Their front-face gates are connected to one another.

There are also two pMOS transistors TP1 and TP2 and a resistor $R_{ref}$ placed between a supply voltage $V_{DD}$ and the source of the transistor TP2. The front-face gates of the transistors TP1 and TP2 are connected to one another. The front-face gate of the transistor TP1 is connected to the drain of TP1.

The reference voltage circuit also comprises transistors configured in a cascode assembly, with specifically nMOS transistors TN3, TN4 and TN6 and the pMOS transistors TP3 and TP4.

The source of the transistor TN3 is connected to the drain of the transistor TN1, the source of the transistor TN4 is connected to the drain of the transistor TN2 and the source of the transistor TN6 is connected to the drain of the transistor TN5. The front-face gates of the transistors TN1, TN2, TN3, TN4, TN5 and TN6 are connected to one another and are connected to the drain of the transistor TN4.

The drain of the transistor TP3 is connected to the drain of TN3 and the drain of TN4 is connected to the drain of TP4. The front-face gates of TP3 and TP4 are connected to one another, connected to the front-face gate of the transistor TP3. The source of TP3 is connected to the drain of TP1 and the source of TP4 is connected to the drain of TP2.

The branch B3 is connected to a low supply terminal of the ring oscillator. In other words, the inverters of the oscillator are placed between a "high" supply voltage $V_{DD}$ and a low supply voltage, corresponding in this circuit to a supply node having a potential $V_{RO}$. This supply node is connected to the branch B3, more precisely to the drain of the transistor TN6, and is also connected to the back gate of the transistor TP2. The branch B3 and the three inverters therefore perform the role of the circuit CPGA in FIG. 4.

The back-face gates of all of the transistors, except for the transistor TP2, are also kept at a fixed potential, equal for example to the ground.

Figure 10:
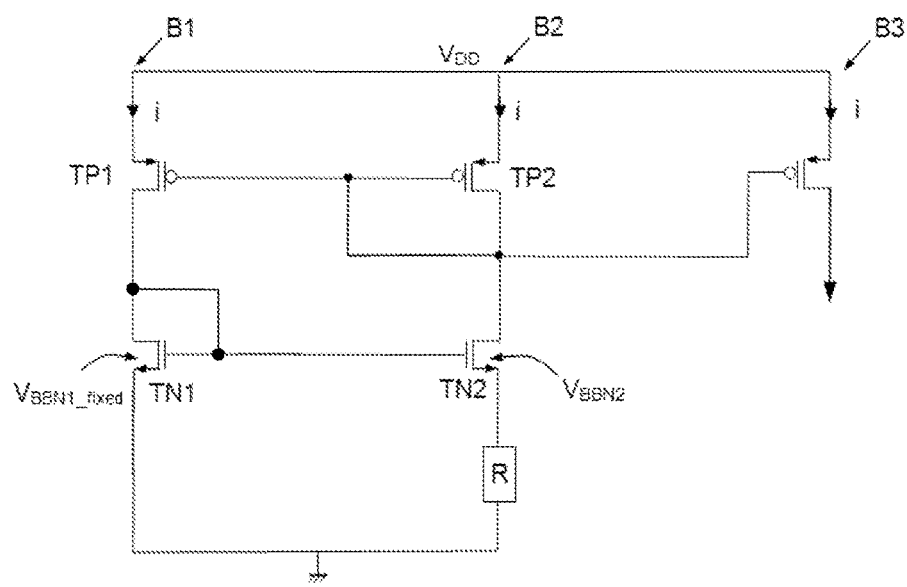
FIG. 10 shows a current generator formed from a circuit according to the invention.

FIG. 10 shows a second application of the circuits according to the invention, specifically a current generator. The generated current $i_{ref}$ is in this example equal to the current i from the three branches B1, B2 and B3 of the current mirror formed by the three identical pMOS transistors TP1, TP2 and TP3. The current $i_{ref}$ is then equal to $V_R/R_{ref}$. It may advantageously be substantially insensitive, as explained above. As is well known to a person skilled in the art, it is possible to obtain a current $i_{ref}$ that is a multiple of the current flowing in the branches B1/B2 by providing different transistor sizes between firstly the transistor TP3 and secondly the transistors TP1/TP2. If it is desired to have a fixed generated current, it is possible for example to use a reference voltage that is highly stable notably in terms of temperature, for example delivered by a bandgap circuit, in order to bias the back gate of the transistor TN2 or TN1. The other back gates of the other transistors, and notably that of the other transistor TN1 or TN2 of the nMOS mirror, are biased to another potential value, advantageously the ground or $V_{DD}$. The choice of the bias voltage depends notably, as has been explained above, on the type of LVT or RVT transistors used to form the circuit.

Figure 1B:
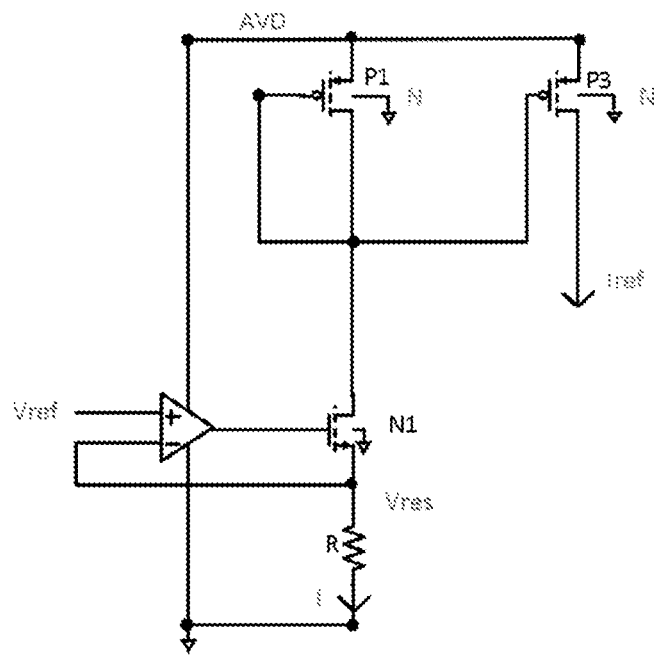
FIG. 1B, already described, shows a current source comprising a resistor and a control circuit for slaving the voltage across the terminals of the resistor according to the prior art.

The generator thus formed is able to generate low current values $i_{ref}$ while still having a low-value and therefore non-bulky reference resistor $R_{ref}$. Specifically, if the current generator is compared with the one from the prior art illustrated in FIG. 1b is, using one and the same reference voltage, it is possible to use a resistance 5 to 10 times lower than that of the circuit from the prior art, by virtue of the voltage division between the reference voltage and the voltage present across the terminals of the resistor.

Figure 11A:
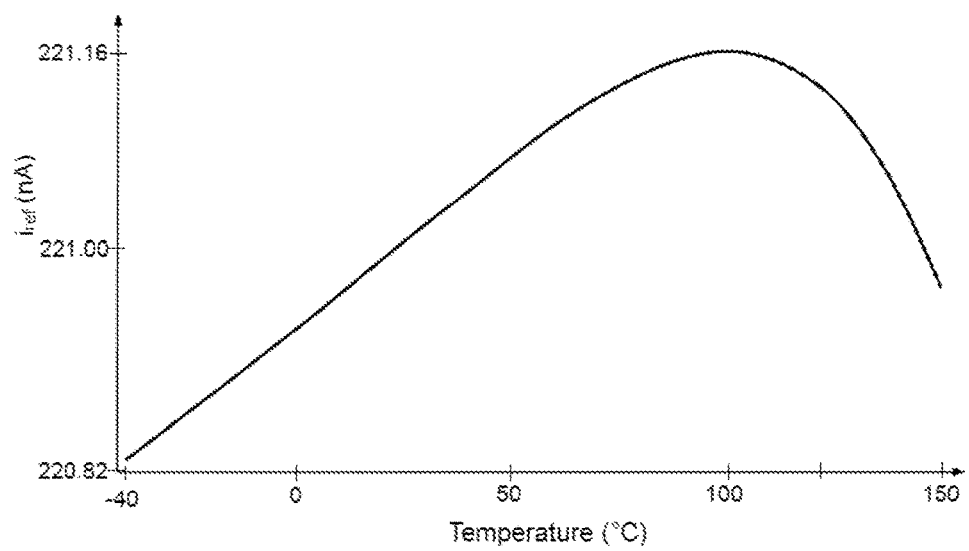
FIG. 11a and FIG. 11b show simulation results obtained for the current generator from FIG. 10.
Figure 11B:
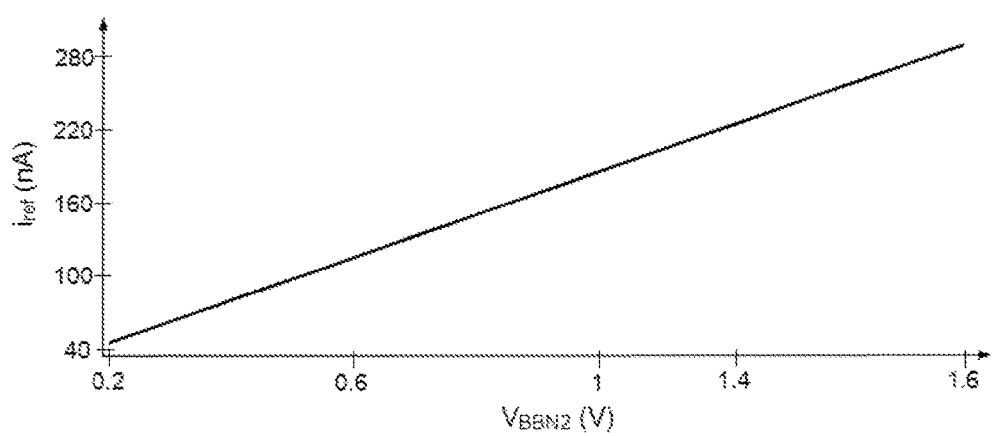

FIG. 11a and FIG. 11b show simulation results obtained for the current generator from FIG. 10.

More specifically, FIG. 11a shows the current $i_{ref}$ generated as a function of temperature. This varies between 220.8 nA and 221.2 nA for a temperature between −40° C. and 150° C. This current generator is therefore highly stable in terms of temperature.

FIG. 11b shows the generated current $i_{ref}$ as a function of the bias potential $V_{BBN2}$ of the back gate of the transistor TN2. It is noted that these two variables are proportional, thereby confirming the fact that the ratio between $V_R$ and $V_{BBN2}$ is constant regardless of the value of $V_{BBN2}$. This ratio therefore remains stable whether the transistors are in weak inversion or strong inversion mode.

Generally speaking, it is possible to form an electronic system comprising an electronic circuit according to the invention.

Furthermore, the term external circuit has been used to denote an electronic circuit consisting of components other than those present in the two branches B1 and B2 and necessary to form an electronic voltage divider circuit according to the present invention. It will however be noted that all "external" circuits described above are in practice able to be formed preferably on one and the same integrated circuit.

The invention claimed is:

1. An electronic voltage divider circuit comprising at least two Fully Depleted Silicon on Insulator (FDSOI) transistors on insulating thin film (TP1, TP2) of a first type connected to a first supply potential and arranged in a current mirror structure and two FDSOI transistors on thin film (TN1, TN2) of a second type and an electrical load of non-zero impedance (R), the transistors each having a front-face main gate ($G_{top}$) and a back-face control gate ($G_{back}$), a drain of a first transistor (TN1) of the second type being connected to the drain of a first transistor (TP1) of the first type, a drain of a second transistor (TN2) of the second type being connected to the drain of a second transistor (TP2) of the first type, the drain of the first transistor of the second type being connected to the front-face gate of this same transistor, the front-face gates of the first and second transistors of the second type being connected to one another, the source of the first transistor of the second type being connected to a second supply potential and said load of non-zero impedance being placed between the source of the second transistor of the second type and said second supply potential, wherein the back-face gates of the first and second transistors of the second type (TN2) are connected to an external circuit (CPGA) applying a non-zero input voltage between these two back-face gates, such that the back-face gate of the first transistor of the second type is brought to a potential ($V_{BBN1}$) lower than that ($V_{BBN2}$) of the back-face gate of the second transistor of the second type if these two transistors are of nMOS type, and that the back-face gate of the first transistor of the second type is brought to a potential ($V_{BBP1}$) greater than that ($V_{BBP2}$) of the back-face gate of the second transistor of the second type if these two transistors are of pMOS type;

as a result of which the voltage across the terminals of said load ($V_{RO}$) constitutes an output voltage equal to a fraction of the input voltage.

2. The electronic circuit according to claim 1, wherein the transistors of the first type are pMOS transistors and the transistors of the second type are nMOS transistors, and wherein the potential ($V_{BBN2}$) applied to the back-face gate of the second transistor of the second type is greater than the potential ($V_{BBN1}$) applied to the back-face gate of the first transistor of the second type.

3. The electronic circuit according to claim 1, wherein the transistors of the first type are nMOS transistors and the transistors of the second type are pMOS transistors, and wherein the potential ($V_{BBN2}$) applied to the back-face gate of the second transistor of the second type is less than the potential ($V_{BBN1}$) applied to the back-face gate of the first transistor of the second type.

4. The electronic circuit according to claim 1, wherein the transistors of the second type are transistors with a low threshold value (LVT).

5. The electronic circuit according to claim 1, wherein the transistors of the second type are transistors with a standard threshold value (RVT).

6. The electronic circuit according to claim 1, wherein the transistors of the second type are identical.

7. The electronic circuit according to claim 1, wherein the transistors of the second type are different, their geometrical ratios of gate width to length being different by at most 20%.

8. The electronic circuit according to claim 1, wherein the voltage between the two back-face gates of the first and second transistors of the second type is high enough that a component B of the voltage across the terminals of the load ($V_{RO}$), proportional to said voltage and independent of a difference between the geometrical ratios of gate width to length of said transistors, is greater, preferably by at least a factor of 10, than a component A of said voltage, which is independent of this voltage and dependent on said difference between the geometrical ratios of gate width to length of said transistors.

9. An electronic system comprising an electronic circuit according to claim 1, further comprising a third transistor of the first type of which the source is connected to the first supply potential, the gate is connected to the gates of the first and second transistors of the first type, and the drain is connected to a node connected to a load circuit.

10. The current source electronic system according to claim 9, wherein a stable reference voltage, for example supplied by a bandgap circuit, is applied as input voltage between the back-face gates of the first and second transistors of the second type.

11. A circuit for generating an oscillating clock signal, comprising a plurality of inverters connected to one another so as to form a loop, an output of one inverter being connected to an input of another inverter and comprising an electronic circuit according to claim 8, wherein said node is connected firstly to a voltage/current supply terminal of said plurality of inverters, and secondly to the back-face gate of one of the first and second transistors of the second type.

12. The electronic circuit according to claim 1, furthermore comprising at least one cascode pair of transistors of the first type placed between the current mirror and the transistors of the second type.

13. The electronic circuit according to claim 1, furthermore comprising at least one cascode pair of transistors of the second type placed between the transistors of the first type and the transistors of the second type.

* * * * *